United States Patent
Mehrmanesh et al.

(10) Patent No.: US 9,866,179 B1
(45) Date of Patent: Jan. 9, 2018

(54) MULTIPATH LINEAR LOW NOISE AMPLIFIER

(71) Applicant: SiTune Corporation, San Jose, CA (US)

(72) Inventors: Saeid Mehrmanesh, Los Altos, CA (US); Vahid M. Toosi, San Jose, CA (US); Marzieh Veyseh, Los Altos, CA (US)

(73) Assignee: SiTune Corporation, San Jose, CA (US)

( * ) Notice: Subject to any disclaimer, the term of this patent is extended or adjusted under 35 U.S.C. 154(b) by 0 days.

(21) Appl. No.: 15/480,291

(22) Filed: Apr. 5, 2017

(51) Int. Cl.
| | |
|---|---|
| *H03F 1/26* | (2006.01) |
| *H03G 3/20* | (2006.01) |
| *H03F 3/189* | (2006.01) |

(52) U.S. Cl.
CPC ............... *H03F 1/26* (2013.01); *H03F 3/189* (2013.01); *H03G 3/20* (2013.01); *H03F 2200/294* (2013.01); *H03F 2200/411* (2013.01); *H03F 2200/451* (2013.01); *H03F 2200/465* (2013.01)

(58) Field of Classification Search
CPC .................................... H03F 1/26; H03G 3/20
USPC ......................................................... 330/134
See application file for complete search history.

(56) References Cited

U.S. PATENT DOCUMENTS

| | | | | |
|---|---|---|---|---|
| 2006/0132235 A1* | 6/2006 | Ozawa | ................ | H03F 3/45475 330/254 |
| 2007/0066250 A1* | 3/2007 | Takahashi | ............ | H03G 3/3047 455/127.1 |
| 2009/0027128 A1* | 1/2009 | Ishiguro | ............... | H03G 1/0088 330/278 |
| 2010/0007419 A1* | 1/2010 | Gilbert | .................... | H03F 1/302 330/254 |
| 2010/0022211 A1* | 1/2010 | Huang | .................. | H04W 52/52 455/232.1 |
| 2010/0176982 A1* | 7/2010 | Lachartre | ............ | H03M 1/1235 341/155 |
| 2011/0193626 A1* | 8/2011 | Gomez | .................. | H03F 3/189 330/124 R |

* cited by examiner

*Primary Examiner* — Patricia T Nguyen
(74) *Attorney, Agent, or Firm* — Hogan Lovells US LLP

(57) ABSTRACT

The present disclosure relates to methods and systems for LNAs with high linearity and low noise for wideband receivers that receive high dynamic range signals. A multi-stage multipath LNA is disclosed in which outputs from various stages are amplified with variable gains and combined in parallel. A smart gain control unit evaluates the noise and non-linearity characteristics associated with each gain stage to configure the variable gains for the various stages to generate an overall LNA gain that minimizes the overall noise and/or non-linearity characteristics of the LNA while ensuring that the overall gain for the LNA satisfies the desired gain. The variable gains may be configured to change smoothly over the dynamic range of the input signal. Noise is minimized by reducing additional gain stages and by the smooth change in gain when switching between stages. High linearity performance is maintained by minimizing the number of gain stages combined.

20 Claims, 7 Drawing Sheets

MULTIPATH LINEAR LOW NOISE AMPLIFIER

BACKGROUND

Low Noise Amplifiers (LNAs) are commonly used in the front-end of radio frequency (RF) communication receivers to amplify information-bearing signals above the noise floor before the signals are processed. They are found in the receivers of both wired and wireless communication systems. Increasingly, wideband wide range RF receivers are used in broadband communication transceivers to receive signals with a large bandwidth, such as ultra wideband (UWB) signals. These wideband RF receivers need LNAs with extremely tight noise and linearity specifications. These requirements become even more stringent when wideband signals have high dynamic range. For example, received signals may have a power level that varies from −90 dBm to +10 dBm, leading to a 100 dBc in dynamic range. However, in LNA designs, there is a delicate tradeoff between amplifier gain, noise and linear characteristic of the LNAs that makes the attainment of both high linearity and low noise difficult. Amplifying high dynamic wideband signals injects noise, further complicating the design tradeoff. As such, it is desired to have LNAs with high linearity and low noise for wideband receivers that receive high dynamic range signals.

SUMMARY

The present disclosure resolves deficiencies in conventional LNAs. A multi-stage multipath LNA is disclosed in which outputs from various stages of the multi-stage LNA are amplified with variable gains, and combined in parallel to meet high linearity and low noise specification. The higher the number of stages of the multi-stage LNA through which an input signal is amplified, the higher the nominal gain. A gain control unit may vary the gains from the various stages that are combined to generate an overall LNA gain that changes smoothly over the dynamic range of the signal. For example, when the power of a received signal decreases, a variable gain for a higher gain stage may be increased along a first curve and the variable gain for a lower gain stage may be decreased along a second curve. The outputs from the two stages are combined to generate a smooth gain change when the multi-stage multipath LNA transitions from the lower gain stage to the higher gain stage. As the power of the received signal decreases further, the variable gain for the higher gain stage may increase until it reaches a maximum value on the curve and may then decrease to a minimum value when the multi-stage multipath LNA transitions to the next higher gain stage. Conversely, when the power of the received signal increases, the variable gain for a lower gain stage may be increased along a curve and the variable gain for a higher gain stage may be decreased along its curve. The outputs from the two stages are combined to generate a smooth gain change when transitioning from the higher gain stage to the lower gain stage. When the power of the received signal is very strong, the LNA output may be taken from the lowest gain stage through its variable gain, or the multi-stage LNA may be bypassed altogether by setting the variable gains for all the stages to be zero and taking the input signal as the output signal directly or through its own variable gain. The result is that noise is minimized by avoid introducing additional gain stages and by a smooth change in gain when switching between stages. High linearity performance is maintained by minimizing the number of gain stages combined to generate a desired LNA gain.

In an exemplary implementation, the present disclosure includes a multi-stage low noise amplifier (LNA) that amplifies an input signal through a series of gain stages to achieve successively higher gains from each successive gain stages. Each gain stage has associated with it noise and non-linearity characteristics. An output from each gain stage is connected to, and multiplied by, a corresponding variable gain to generate a gain path for each of the gain stages. The input signal is additionally connected to, and multiplied by, a direct path variable gain to generate a gain path for a direct path. The present disclosure also includes a combiner to add the gain path for each gain stage of the plurality of gain stages and the gain path for the direct path to generate a final gain for the multi-stage LNA with an overall noise and non-linearity characteristics. The present disclosure additionally includes a gain control unit that evaluates the noise and non-linearity characteristics associated with each gain stage. Using the results from the evaluation, the gain control unit configures the variable gain corresponding to each gain stage and the direct path variable gain in response to a desired gain for the multi-stage LNA. The gain control unit configures the plurality of variable gains so as to reduce the overall noise or non-linearity characteristics of the multi-stage LNA while ensuring that the final gain for the multi-stage LNA satisfies the desired gain.

In another exemplary implementation, the present disclosure includes a method for amplifying an input signal through a series of gain stages to achieve successively higher gains from each successive gain stages. Each gain stage has associated with it noise and non-linearity characteristics. An output from each gain stage is multiplied by a corresponding variable gain to generate a gain path for each of the gain stages. The input signal is additionally multiplied by a direct path variable gain to generate a gain path for a direct path. The method also includes combining the gain path for each of the gain stages and the gain path for the direct path to generate an output signal whose power is amplified by a final gain from the power of the input signal with an overall noise and non-linearity characteristics. The method also includes evaluating by a processor the noise and non-linearity characteristics associated with each gain stage. The method additionally includes the processor using the results of the evaluation to configure the variable gain corresponding to each gain stage and the direct path variable gain in response to a desired gain of the power of the output signal from the power of the input signal. The variable gains are configured so as to reduce the overall noise or non-linearity characteristics of the output signal while ensuring that the final gain for the output signal satisfies the desired gain.

BRIEF DESCRIPTION OF THE DRAWINGS

The accompanying drawings constitute a part of this specification and, together with the specification, illustrate certain exemplary implementations of this disclosure. To facilitate this description, like reference numerals designate like structural elements. Embodiments are illustrated by way of example and not by way of limitation in the figures of the accompanying drawing.

DETAILED DESCRIPTION

Figure 1:
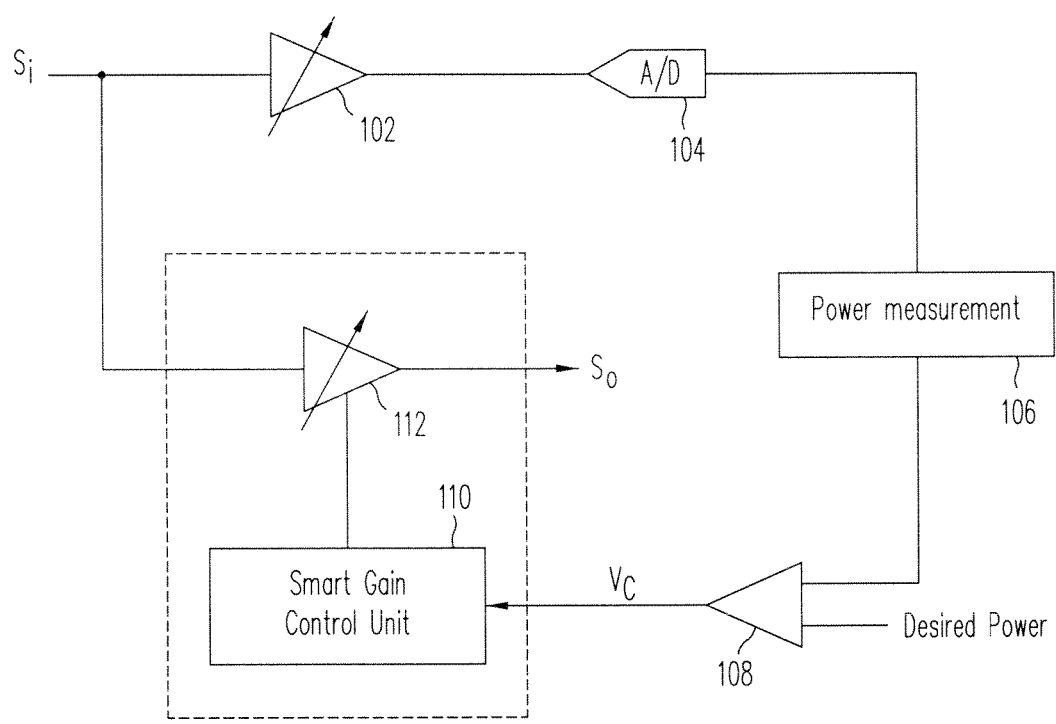
FIG. 1 illustrates an exemplary front end of a communications receiver that uses a multi-stage multipath LNA to amplify the signal to the desired power level, in accordance with various embodiments.

Systems and methods described herein provide a multi-stage multipath LNA for use in the front end of an RF receiver to amplify high dynamic range RF input signals. Outputs from various stages of the multi-stage LNA are multiplied with variable gains and combined to amplify the input signal to a desired power level or a desired signal-to-noise ratio. Outputs from the various stages may be weighted and combined in a parallel topology to vary the overall LNA gain in response to the wide dynamic range of the input signal. The input signal may travel through different paths of the parallel topology—with each path encompassing a different number of stages of the multi-stage LNA—and with each path multiplied with the corresponding variable gain to achieve a desired gain for each path, giving rise to the name 'multipath.' The multiple paths may be combined to achieve a desired overall LNA gain. To achieve higher gain, a path encompassing a greater number of stages may be selected for combining. However, because each stage of the multi-stage LNA may introduce non-linearity and/or noise, paths that encompass a fewer number of stages and consequently having lower gain may be given more weight when combined to achieve a desired LNA gain while minimizing non-linearity and/or noise. In addition, when transitioning from a path with a lower gain to a path with a higher gain, the path encompassing a greater number of stages may be multiplied with a gradually increasing variable gain and combined with the lower gain path multiplied with a gradually decreasing variable gain. The combination of the two paths with opposite direction of variable gain change produces a smooth overall gain change during the transition. Conversely, when transitioning from a path with a higher gain to a path with a lower gain, the higher gain path may be multiplied with a gradually decreasing variable gain and combined with the lower gain path multiplied with a gradually increasing variable gain. The effect is a smooth transition in the overall LNA gain to minimize noise when switching between the stages of the multi-stage LNA. In one or more embodiments, more than two paths may be combined. For example, the path with the lowest gain may be combined with multiple higher gain paths such as by combining the lowest gain stage (e.g., gain stage 1) with the next two higher gain stages (e.g., gain stage 2 and gain stage 3) as the desired overall LNA gain is increased.

As the LNA gain is increased further, gain stage 1 may remain unchanged, the variable gain for gain stage 2 may ramp down, and the variable gain for gain stage 4 may ramp up. As the LNA gain is increased even further, gain stage 1 remains unchanged, the variable gain for gain stage 3 may ramp down, and the variable gain for gain stage 4 may continue to ramp up.

The number of paths combined may also be minimized to minimize non-linearity introduced by additional paths from other gain stages. For example, in some embodiments, a maximum of two paths from two adjacent gain stages may be combined during a transition window. Otherwise, only one path is selected outside of the transition window. In other embodiments, as shown by the above example, a maximum of three paths from adjacent or non-adjacent gain stages may be combined. A gain control unit controls the variable gains of the various stages of the multi-stage LNA and effectively determines which gain stages are combined to achieve a desired overall LNA gain. The linearity of each stage may be further improved by a feed-forward technique. Thus, the multi-stage multipath LNA achieves highly linear gain with minimum noise to meet the extremely tight noise and linearity specification of wideband RF receivers that receive large dynamic range signals.

FIG. 1 illustrates an exemplary front end of a communications receiver that uses a multi-stage multipath LNA to amplify the signal to the desired power level, in accordance with various embodiments. An input signal, denoted as $S_i$, is received by a communication receiver. A front end amplifier 102, which may have a variable gain, amplifies the input signal to generate an amplified signal that may be used for power measurement. An analog-to-digital converter (A/D) 104 converts the output from front end amplifier 102 to a digital signal. A power measurement unit 106 measures the digitized signal to estimate the power of the digitized signal. Knowing the gain of front end amplifier 102, power measurement unit 106 may estimate the power of the input signal. In one embodiment, power measurement unit 106 may integrate the digitized signal to estimate an average power of the input signal over a measurement period. The power of the input signal may be expressed in dbm or as a signal-to-noise ratio. A power comparator 108 compares the measured power with a desired signal power to generate an LNA gain Vc. The desired signal power may be chosen as the quiescent signal power for subsequent processing of the input signal by the front end of the communication receiver. The LNA gain Vc represents the amount by which a multi-stage multipath LNA 112 is to amplify the input signal to attain the desired signal power. When the input signal has high dynamic range, Vc may have a wide range of values. A smart gain control unit 110 translates Vc into the variable gains for the multiple stages of the multipath LNA. By setting the variable gains for some of the stages to 0, smart gain control unit 110 excludes these stages and effectively selects the weighting of the gain stages to be combined. A multi-stage multipath LNA 112 receives the input signal and applies the variable gains of the multiple stages to generate the various stage outputs that are combined into an output signal $S_o$ with the desired power. Details of operations smart gain control unit 110 and multi-stage multipath LNA 112 are discussed below.

Figure 2:
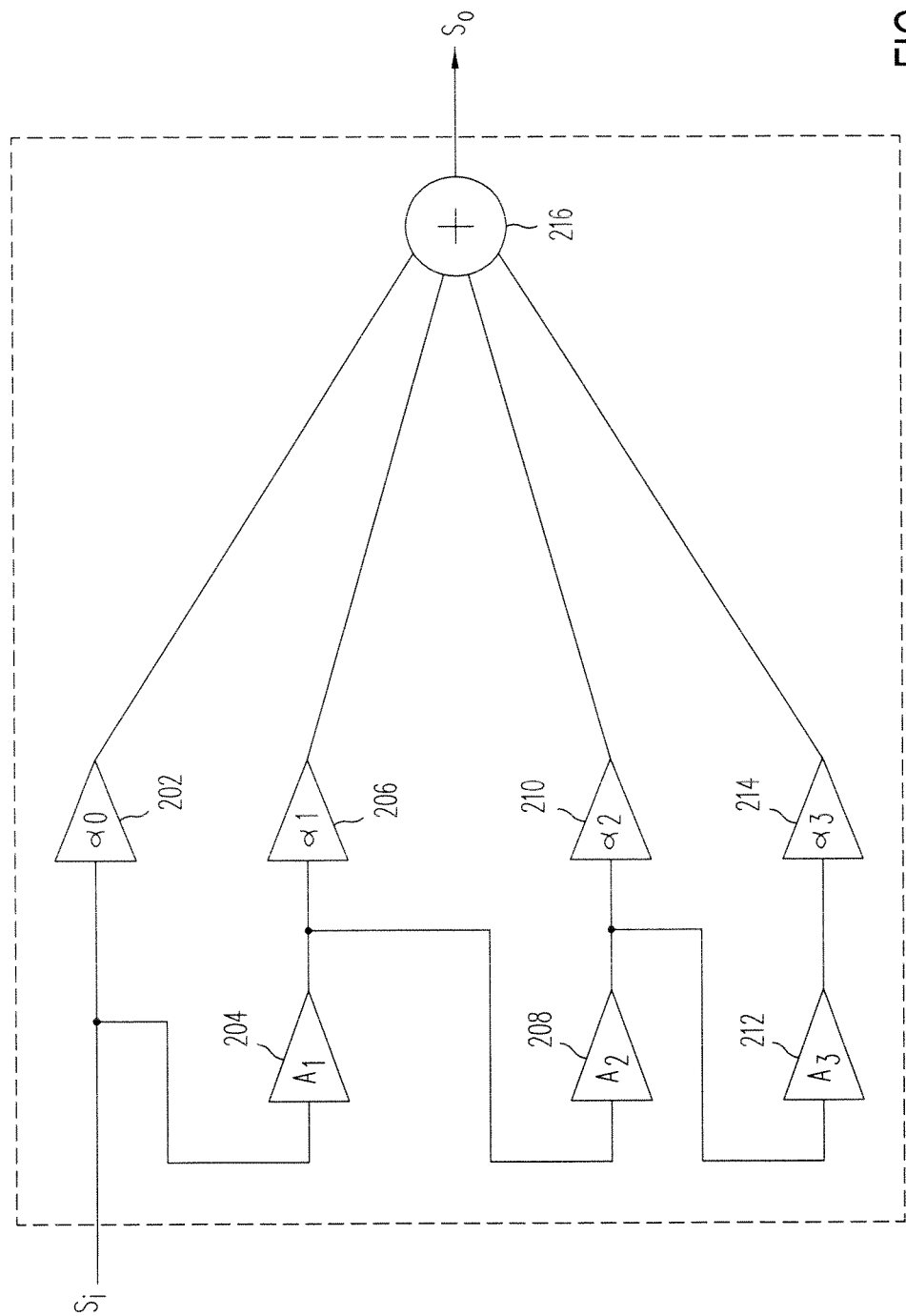
FIG. 2 illustrates an exemplary block diagram of a 3-stage multipath LNA, in accordance with various embodiments.

FIG. 2 illustrates an exemplary block diagram of a 3-stage multipath LNA, in accordance with various embodiments. A combiner 216 combines signals from four paths, which includes weighted outputs from the three stages of the 3-stage LNA and from a direct path from the input. A first path receives the input signal Si directly and has a variable gain denoted by $\alpha_0$ 202; a second path has a fixed gain $A_1$ 204 from the output of the first stage and a variable gain $\alpha_1$ 206. The output of the first stage also feeds into the input of a second stage. A third path has a fixed gain $A_1$ 204*$A_2$ 208 from the output of the second stage and a variable gain $\alpha_2$ 210. The output of the second stage also feeds into the input of a third stage. A fourth path has a fixed gain $A_1$ 204*$A_2$ 208*$A_3$ 212 from the output of the third stage and a variable gain $\alpha_3$ 214. Combiner 216 combines the gains from the four paths to generate a total gain of:

$$\text{Total Gain} = \alpha_0 + \alpha_1 \times A_1 + \alpha_2 \times A_1 \times A_2 + \alpha_3 \times A_1 \times A_2 \times A_3 \qquad \text{(Eq. 1)}$$

Each of the fixed gains $A_1$ 204, $A_2$ 208, and $A_3$ 212 has a gain greater than 1 so that outputs from successively higher stages have more gain, i.e., $A_1 \times A_2 \times A_3 > A_1 \times A_2 > A_1$. However, each successive stage may add non-linearity and/or noise to those characteristics of the previous stage. As such, there is a tradeoff between a desired gain and non-linearity/noise characteristics. The variable gains $\alpha_0$ 202, $\alpha_1$ 206, $\alpha_2$ 210, and $\alpha_3$ 214 are referred to as sub-LNA gains. In one embodiment, each of $\alpha_0$ 202, $\alpha_1$ 206, $\alpha_2$ 210, and $\alpha_3$ 214 may have a value between 0 and 1. When the power of input signal Si is sufficiently strong, only the first path may be enabled so that $\alpha_0$ 202=1, $\alpha_1$ 206=0, $\alpha_2$ 210=0, and $\alpha_3$ 214=0 to yield a total gain of 1. As the input signal power decreases, the first path may be disabled and the second path enabled by setting $\alpha_0$ 202=0 and $\alpha_1$ 206 to a non-zero value to yield a total gain of $\alpha_1 \times A_1$. As the input signal power decreases further, the second path may be disabled and the third path enabled by setting $\alpha_1$ 206=0 and $\alpha_2$ 210 to a non-zero value to yield a total gain of $\alpha_2 \times A_1 \times A_2$. As the input signal power decreases even further, the third path may be disabled and the fourth path enabled by setting $\alpha_2$ 210=0 and $\alpha_3$ 214 to a non-zero value to yield a total gain of $\alpha_3 \times A_1 \times A_2 \times A_3$. In other embodiments, because higher gain stages may have higher noise and/or non-linearity, it may be desirable to combine multiples paths of lower gain to achieve a desired overall gain. In addition, to minimize the noise and/or non-linearity of the multipath LNA, a lower gain stage may be weighted more than a higher gain stage by making the sub-LNA gain for the lower gain stage higher than that for the higher gain stage. For example, to achieve an equivalent gain to the $\alpha_3 \times A_1 \times A_2 \times A_3$ output gain from the third stage but with reduced noise and/or non-linearity, it may be desirable to combine the outputs of the second and third stages to generate $\alpha_2 \times A_1 \times A_2 + \alpha_1 \times A_1$. To further reduce the noise and/or non-linearity, it may be desirable to configure $\alpha_1 > \alpha_2$.

During the gain transition from one path to the next path, the sub-LNA gains for the two paths may be controlled to yield a smooth transition in gain. For example, during the transition window from the first path to the second path, $\alpha_0$ 202 may slowly ramp down from 1 to 0, and $\alpha_1$ 206 may slowly ramp up from 0 to 1, so that the increase in the total gain from $\alpha_0$ (=1) to $\alpha_0 + \alpha_1 \times A_1$ may be gradual to avoid a sharp change in gain, thereby avoiding injecting non-linearity and/or noise to the LNA. When the input signal power decreases sufficiently, $\alpha_0$ 202 may ramp down to 0 so that only the gain from the second path $\alpha_1 \times A_1$ is applied to the input signal. Further decrease in the input signal power may cause $\alpha_1$ 206 to ramp up to 1 so that the total gain becomes $A_1$. Similarly, during the transition window from the second path to the third path, $\alpha_1$ 206 may slowly ramp down from 1 to 0, and $\alpha_2$ 210 may slowly ramp up from 0 to 1, so that the increase in the total gain from $\alpha_1 \times A_1$ (or $A_1$ when $\alpha_1$=1) to $(\alpha_1 \times A_1 + \alpha_2 \times A_1 \times A_2)$ to $\alpha_2 \times A_1 \times A_2$ (or $A_1 \times A_2$ when $\alpha_2$=1) may have a smooth gain transition. Conversely, when the input signal power increases and causes the third path to transition back to the second path, at 206 may slowly ramp up from 0 to 1, and $\alpha_2$ 210 may slowly ramp down from 1 to 0, so that the decrease in the total gain from $\alpha_2 \times A_1 \times A_2$ (or $A_1 \times A_2$ when $\alpha_2$=1) to $(\alpha_1 \times A_1 + \alpha_2 \times A_1 \times A_2)$ to $\alpha_1 \times A_1$ (or $A_1$ when $\alpha_1$=1) may have a smooth gain transition. Other gain transition scenarios are possible. For example, a transition may occur between two paths with non-adjacent gain stage, such as between $\alpha_3 \times A_1 \times A_2 \times A_3$ and $\alpha_1 \times A_1$. In other embodiments, a transition may occur between three paths, such as between $\alpha_3 \times A_1 \times A_2 \times A_3$ and $(\alpha_1 \times A_1 + \alpha_2 \times A_1 \times A_2)$.

Figure 3:
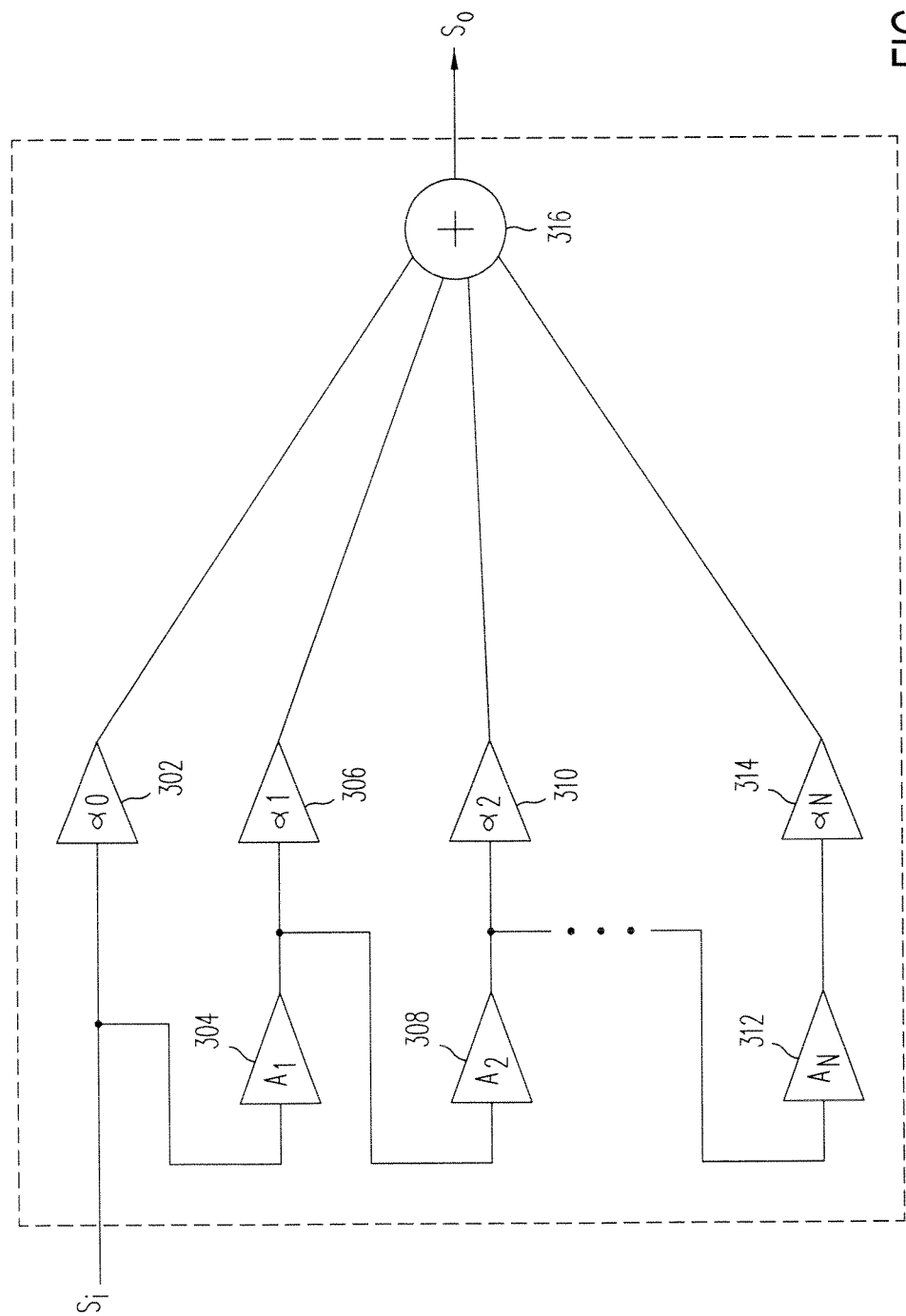
FIG. 3 illustrates an exemplary block diagram of a generalized N-stage multipath LNA, in accordance with various embodiments.

FIG. 3 illustrates an exemplary block diagram of a generalized N-stage multipath LNA, in accordance with various embodiments. A combiner 316 combines signals from all N+1 paths, which includes outputs from the N stages of the N-stage LNA and a direct path from the input. As shown, $A_1$, $A_2$ ... $A_N$ are the fixed gains from each stage. The variable gains $\alpha_0, \alpha_1, \alpha_2 \ldots \alpha_N$ are the sub-LNA gains. The total gain for the N-stage multipath LNA may be expressed as:

$$\text{Total Gain} = \alpha_0 + \alpha_1 \times A_1 + \alpha_2 \times A_1 \times A_2 + \alpha_3 \times A_1 \times A_2 \times A_3 + \ldots + \alpha_N \times A_1 \times A_2 \times A_3 \ldots \times A_N \qquad \text{(Eq. 2)}$$

As in the 3-stage multipath LNA of FIG. 2, when the power of input signal Si is sufficiently strong, only the direct path may be enabled so that $\alpha_0$=1, $\alpha_1, \alpha_2 \ldots \alpha_N$=0 to yield a total gain of 1. As the input signal power decreases, a path with stronger gain from a higher stage number may be enabled while a path with weaker gain from a lower stage number of the N-stage LNA may be disabled in combiner 316. An extremely weak signal may be amplified using the gain from the last stage of $\alpha_N \times A_1 \times A_2 \times A_3 \ldots \times A_N$. As before, during the transition window when enabling one path while disabling another path, the sub-LNA gains for the two paths may be ramped in opposite directions to yield a smooth transition in the total gain when the gains from the two stages are combined.

Figure 4:
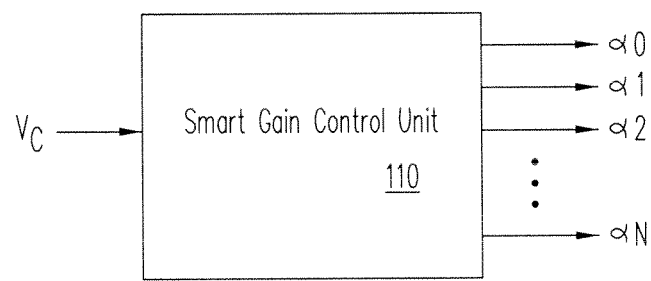
FIG. 4 illustrates an exemplary block diagram of a Smart Gain Control Unit used to control the sub-LNA gains of an N-stage multipath LNA, in accordance with various embodiments.

FIG. 4 illustrates an exemplary block diagram of a Smart Gain Control Unit used to control the sub-LNA gains of an N-stage multipath LNA, in accordance with various embodiments. The Smart Gain Control Unit 110 may receive the LNA gain Vc based on the difference between the estimated power of the received input signal and a desired quiescent signal power as discussed in FIG. 1. LNA gain Vc represents the amount by which the input signal is to be amplified. Smart Gain Control Unit 110 translates Vc into the N sub-LNA gains $\alpha_0, \alpha_1, \alpha_2 \ldots \alpha_N$ of the N-stage multipath LNA. In one embodiment, $\alpha_0, \alpha_1, \alpha_2 \ldots \alpha_N$ are set between 0 and 1. As shown in Eq. 2 above, $\alpha_1, \alpha_2 \ldots \alpha_N$ are multiplied with the fixed gain $A_1$, $(A_1 \times A_2)$, $(A_1 \times A_2 \times A_3) \ldots (A_1 \times A_2 \ldots \times A_N)$, respectively, from the output of the respective stage of the N-stage multipath LNA. To minimize noise and maintain linearity, it may be desirable to enable the sub-LNA gain for only the lowest stage that is sufficient to achieve the desired LNA gain Vc while disabling the sub-LNA gains for all higher stages. It may also be desirable to minimize the number of paths combined to minimize non-linearity introduced by additional paths from other gain stages. For example, a maximum of two paths from two adjacent gain stages may be combined during a transition period when it is necessary to enable a path with a higher gain or a lower gain as discussed with respect to FIG. 2 and FIG. 3. Otherwise, it is preferable to use a single path with the lowest gain to meet the LNA gain Vc. In other embodiments, a maximum of three paths from adjacent or non-adjacent gain stages may be combined.

In other embodiments, Smart Gain Control Unit 110 may have information on the noise and non-linearity characteristics associated with each stage of the N-stage multipath LNA. From these characteristics, Smart Gain Control Unit 110 may configure the sub-LNA gains for multiple stages to minimize noise and/or non-linearity, such as by enabling the sub-LNA gains associated with lower gain stages, so that the combined gain has the desired LNA gain Vc while achieving better overall noise and/or non-linearity characteristics compared to using a single higher gain stage. In addition, a gain stage with better noise and/or non-linearity characteristics may be weighted more by configuring its sub-LNA gain to be greater than that of a gain stage with worse noise and/or non-linearity characteristics. Also as discussed, when transitioning from one path to another, the sub-LNA gains for the two paths may be ramped in opposite directions to yield a smooth transition in the total gain rather than sharply turning off one path and turning on the other path, which may cause a sharp gain change and the injection of noise.

In one or more embodiments, when the LNA gain Vc is low, $\alpha_0=1$, $\alpha_1$, $\alpha_2$ ... $\alpha_N=0$. As the LNA gain Vc increases, $\alpha_0$ may ramp down to 0 and $\alpha_1$ may ramp up to 1 during a first transition window to generate a gain of $\alpha_0+\alpha_1 \times A_1$ until the gain becomes $A_1$ when $\alpha_0$ reaches 0 and $\alpha_1$ reaches 1. As the LNA gain Vc increases further, $\alpha_1$ may ramp down to 0 and $\alpha_2$ may ramp up to 1 during a second transition window to generate a gain of $\alpha_1 \times A_1 + \alpha_2 \times A_1 \times A_2$ until the gain becomes $A_1 \times A_2$ when $\alpha_1$ reaches 0 and $\alpha_2$ reaches 1. Further increase in LNA gain Vc causes additional transitions to successively higher gain stages. When the LNA gain Vc is near the maximum, a final transition from stage (N−1) to stage N may involve ramping $\alpha_{N-1}$ ramp down to 0 and ramping $\alpha_N$ up to 1 to generate a gain of $\alpha_{N-1} \times A_1 \times A_2 \times A_3 \ldots \times A_{N-1} + \alpha_N \times A_1 \times A_2 \times A_3 \ldots \times A_N$. Finally when the LNA gain Vc is at the maximum, the gain becomes $A_1 \times A_2 \times A_3 \ldots \times A_N$ when $\alpha_{N-1}$ reaches 0 and $\alpha_N$ reaches 1. The process reverses when the LNA gain Vc decreases so that when transitioning from a higher gain stage to a lower gain stage, the sub-LNA gain for the higher gain stage may ramp from 1 to 0 and the sub-LNA gain for the lower gain stage may ramp from 0 to 1. Smart Gain Control Unit 110 may be implemented in firmware, software, hardware, or any combination thereof.

Figure 5:
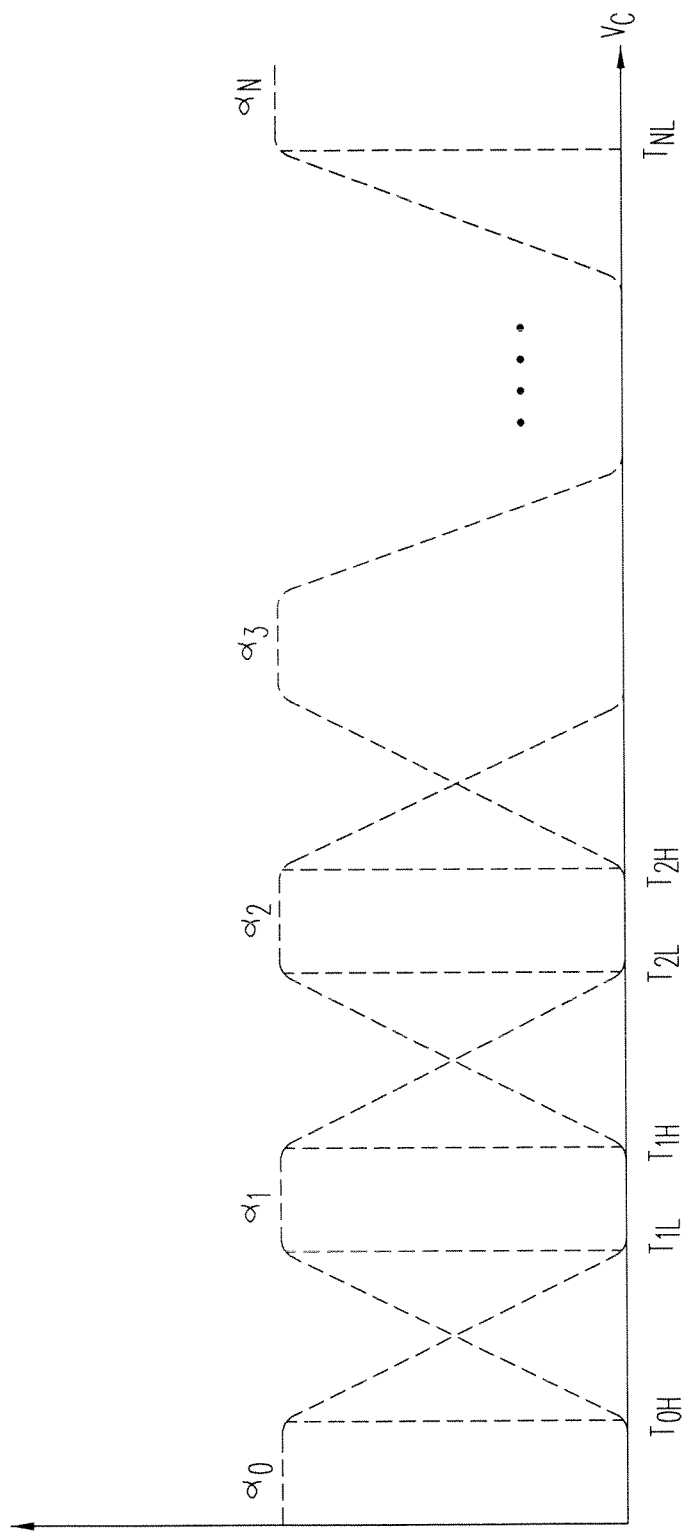
FIG. 5 illustrates the variation of the sub-LNA gains of an N-stage multipath LNA as a function of the overall LNA gain Vc to generate a smooth gain transition when switching between gain stages, in accordance with various embodiments.

FIG. 5 illustrates the variation of the sub-LNA gains ($\alpha_0$, $\alpha_1$, $\alpha_2$ ... $\alpha_N$) of an N-stage multipath LNA as a function of the overall LNA gain Vc to generate a smooth gain transition when switching between gain stages, in accordance with various embodiments. As shown, at most two adjacent gain stages are enabled at the same time when transitioning between the two gain stages. Otherwise, only a single stage of the lowest gain necessary to achieve the LNA gain Vc is enabled. The ramping up and ramping down of two adjacent gain stages are shown as beginning and ending at approximately the same LNA gain Vc. The slopes of the ramp-up and ramp-down waveforms of two adjacent gain stages are also shown as having approximately the same magnitude but with opposite sign. However, in other embodiments, the ramping up and ramping down of two adjacent gain stages may have different slopes and/or may begin and/or end at different LNA gain Vc to create non-symmetrical overlap regions in the waveforms. In other embodiments, more than two gain stages and/or non-adjacent gain stages may be enabled when transitioning between gain stages.

As shown in FIG. 5, when the LNA gain Vc is less than a threshold denoted as $T_{oH}$, $\alpha_0=1$, $\alpha_1$, $\alpha_2$ ... $\alpha_N=0$ to select the direct path. As the LNA gain Vc exceeds $T_{oH}$, $\alpha_0$ starts to ramp down and $\alpha_1$ starts to ramp up to start disabling the direct path and start enabling the output from the higher gain of the first stage of the N-stage LNA. When the LNA gain Vc reaches $T_{1L}$, $\alpha_0=0$ and $\alpha_1=1$ so that the direct path is completely disabled and only the first stage is enabled. The period when the LNA gain Vc is within ($T_{oH}$, $T_{1L}$) is the transition period between the direct path and the first stage. $\alpha_1$ remains at 1 and $\alpha_0$, $\alpha_2$ ... $\alpha_N=0$ from when the LNA gain Vc=$T_{1L}$ until when the LNA gain Vc exceeds $T_{1H}$ when $\alpha_1$ starts to ramp down and $\alpha_2$ starts to ramp up to start disabling the output from the first stage and start enabling the output from the higher gain of the second stage. When the LNA gain Vc reaches $T_{2L}$, $\alpha_1=0$ and $\alpha_2=1$ so that the first stage is completely disabled and only the second stage is enabled. The period when the LNA gain Vc is within ($T_{1L}$, $T_{2L}$) is the transition period between the first stage and the second stage. $\alpha_2$ remains at 1 and $\alpha_0$, $\alpha_1$, $\alpha_3$ ... $\alpha_N=0$ from when the LNA gain Vc=$T_{2L}$ until when the LNA gain Vc exceeds $T_{2L}$. The process repeats until the LNA gain Vc reaches $T_{NL}$, when $\alpha_N=1$ and $\alpha_0$, $\alpha_1$, $\alpha_2$ ... $\alpha_{N-1}=0$ to generate the maximum gain from last stage.

Figure 6:
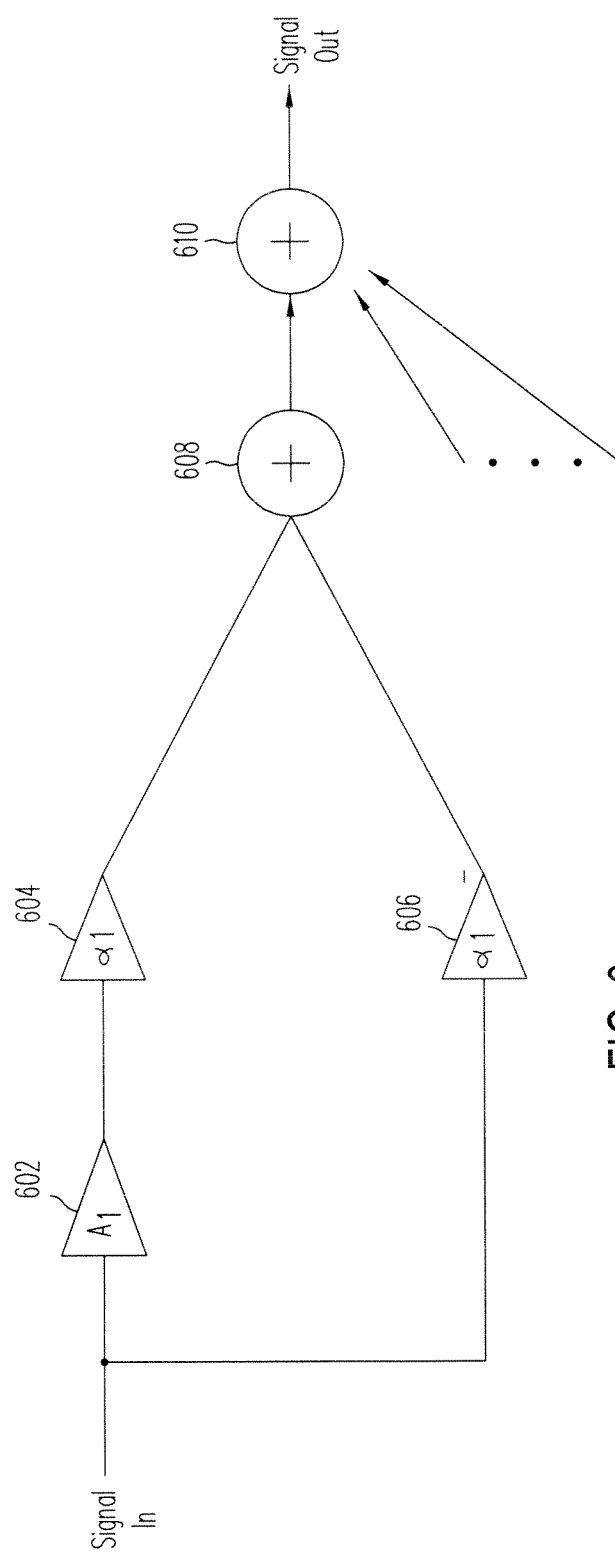
FIG. 6 illustrates compensation of the sub-LNA gain with a feedforward technique to linearize the gain of each gain stage of an N-stage multipath LNA, in accordance with various embodiments.

To improve linearity even further, an individual gain stage of an N-stage multipath LNA may be compensated with a feed-forward technique. FIG. 6 illustrates compensation of the sub-LNA gain with a feed-forward technique to linearize the gain of each gain stage of an N-stage multipath LNA, in accordance with various embodiments. FIG. 6 shows the compensation of the gain from a first stage of an N-stage multipath LNA. An input signal is amplified in a first path by the fixed gain $A_1$ 602 and the variable sub-LNA gain $\alpha_1$ 604. The input signal is also amplified in a second path by a second sub-LNA gain 606 that also has a gain of $\alpha_1$ but with a negative polarity. In another embodiment, the second sub-LNA gain 606 may have a gain magnitude different from $\alpha_1$. In another embodiment, the sub-LNA gain 606 may be a non-linear gain. A combiner 608 combines the two paths to generate a compensated gain from the first stage. Each stage or a subset of the stages may be individually compensated with the feed-forward technique. A second combiner 610 combines the compensated gains from all the various stages of the N-stage multipath LNA to generate the output signal.

Figure 7:
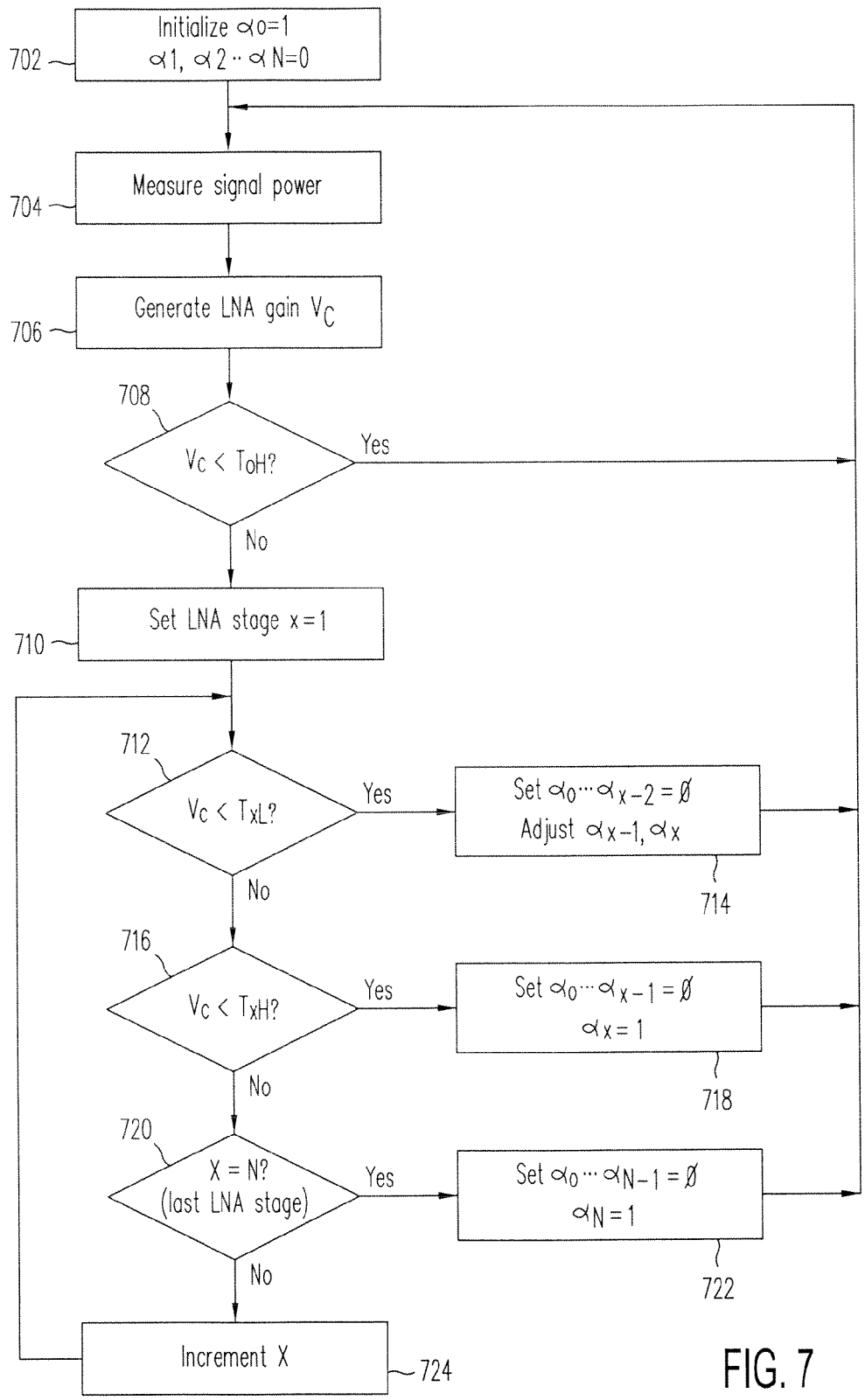
FIG. 7 illustrates an exemplary flow chart of an algorithm that may be implemented in software, firmware, or hardware to perform the gain control function of the Smart Gain Control Unit to control the sub-LNA gains of an N-stage multipath LNA, in accordance with various embodiments.

FIG. 7 illustrates an exemplary flow chart of an algorithm that may be implemented in software, firmware, or hardware to perform the gain control function of the Smart Gain Control Unit to control the sub-LNA gains of an N-stage multipath LNA, in accordance with various embodiments. A processor may execute the algorithm of FIG. 7 to generate the variation of the sub-LNA gains $\alpha_0$, $\alpha_1$, $\alpha_2$ ... $\alpha_N$ of an N-stage multipath LNA shown in the waveform of FIG. 5 as a function of the LNA gain Vc.

In 702, the processor initializes $\alpha_0=1$, $\alpha_1$, $\alpha_2$ ... $\alpha_N=0$ to correspond to the settings for the sub-LNA gains when the LNA gain Vc is the lowest. Here, only the direct path from the input signal is enabled and the N paths from the N stages of the N-stage multipath LNA are disabled in the combiner of FIG. 2 or FIG. 3. In 704, the processor initiates a measurement of the estimated power of the input signal. For example, the processor may activate the front end amplifier 102, A/D 104, and power measurement unit 106 of FIG. 1 to measure or estimate the power of the input signal. In 706, the processor may activate the power comparator 108 of FIG. 1 to compare the measured power with a desired signal power to generate the LNA gain Vc, which represents the amount by which a N-stage multipath LNA is to amplify the input signal to attain the desired signal power.

In 708, the processor compares the LNA gain Vc with the threshold $T_{oH}$ of FIG. 5 to determine if the LNA gain Vc is at the lowest value. If the LNA gain Vc is less than $T_{oH}$, then the initial sub-LNA gain setting of ($\alpha_0$=1, $\alpha_1$, $\alpha_2$ ... $\alpha_N$=0) for the sub-LNA is applied to the N-stage multipath LNA to select the direct path and the processor may repeat the power measurement in 704 during the next measurement period. Otherwise, in 710, the processor initializes a stage counter x to 1 to prepare for successively comparing the LNA gain Vc with threshold gain levels associated with the various stages of the N-stage multipath LNA to determine the value of the LNA gain Vc and to set the corresponding values for the sub-LNA gains. In 712, the processor compares the LNA gain Vc with a first gain threshold associated with the first stage of the N-stage multipath LNA shown as $T_{1L}$ in FIG. 5. $T_{1L}$ may represent the gain threshold above which the sub-LNA gain $\alpha_0$ for the direct path is disabled. Thus, $T_{1L}$ may represents the end of the transition period for the N-stage multipath LNA to transition from the first path gain of $\alpha_0$ to the second path gain of $\alpha_1 \times A_1$. If the LNA gain Vc is less than $T_{1L}$, in 714, the Smart Gain Control Unit maps $\alpha_0$, and $\alpha_1$ to the values on the ramp-up and ramp-down waveforms in FIG. 5 that correspond to the transition period between the direct path and the first stage when the LNA gain Vc is within ($T_{0H}$, $T_{1L}$). $\alpha_2$ ... $\alpha_N$ remain at 0. The sub-LNA gains $\alpha_0$, $\alpha_1$, $\alpha_2$ ... $\alpha_N$ are applied to the N-stage multipath LNA and the processor may repeat the power measurement in 704 during the next measurement period.

If in 712, the LNA gain Vc is greater than or equal to $T_{1L}$, the processor in 716 compares the LNA gain Vc with a second gain threshold associated with the first stage of the N-stage multipath LNA shown as $T_{1H}$ in FIG. 5. If the LNA gain Vc is less than $T_{1H}$ so that it is between $T_{1L}$ and $T_{1H}$, the second path represented by the first gain stage is fully enabled. The processor in 718 sets $\alpha_1$=1, and $\alpha_0$, $\alpha_2$ ... $\alpha_N$=0. The processor may have information on the noise and non-linearity characteristics associated with each stage of the N-stage multipath LNA. By evaluating these characteristics, the processor may configure the sub-LNA gains for multiple stages to minimize noise and/or non-linearity while achieving the desired LNA gain Vc. For example, a gain stage with better noise and/or non-linearity characteristics, such as a lower gain stage, may be weighted more by configuring its sub-LNA gain to be greater than that of a gain stage with worse noise and/or non-linearity characteristics. In one or more embodiments, the processor may configure $\alpha_0$ to be non-zero and may configure $\alpha_1$ to be less than 1 when then LNA gain Vc is between $T_{1L}$ and $T_{1H}$ if the combined gain from such weighting of the direct path and the first stage of the N-stage multipath LNA achieves the LNA gain Vc while reducing overall noise and/or non-linearity characteristics compared to fully enabling the first stage alone by setting $\alpha_1$=1. The sub-LNA gains $\alpha_0$, $\alpha_1$, $\alpha_2$ ... $\alpha_N$ are applied to the N-stage multipath LNA and the processor may repeat the power measurement in 704 during the next measurement period.

If, in 716, the LNA gain Vc is greater than or equal to $T_{1H}$, the processor in 720 determines if it needs to determine the sub-LNA gain for additional gain stages by comparing the stage counter to N. If the sub-LNA gain for additional gain stages are to be determined, the processor increments the stage counter in 724 and repeats the comparison of the LNA gain Vc with the first gain threshold for the next stage (e.g., $T_{2L}$) in 712. If the LNA gain Vc is less than the first gain threshold for the next stage, in 714, the Smart Gain Control Unit maps the sub-LNA gains for the current stage and the next stage to the values on the ramp-up and ramp-down waveforms in FIG. 5 that correspond to the transition period between the current stage and the next stage. The sub-LNA gains for the next stage and the current stage during the transition period are determined and the sub-LNA gains $\alpha_0$, $\alpha_1$, $\alpha_2$ ... $\alpha_N$ are applied to the N-stage multipath LNA in 714. Otherwise, the processor determines if the LNA gain Vc is less than the second gain threshold for the next stage (e.g., $T_{2H}$) in 716 to determine whether to fully enable the sub-LNA gain for the next stage. In one or more embodiments, the processor may configure one or more of the sub-LNA gains for the lower stages to be non-zero and may configure the sub-LNA gain for the current stage to be less than 1 if the combined gain from such weighting of the multiple stages of the N-stage multipath LNA achieves the LNA gain Vc while reducing overall noise and/or non-linearity characteristics compared to fully enabling the sub-LNA gain for the current stage alone. For example, the processor may configure $\alpha_0$ and $\alpha_1$ to be non-zero and may configure $\alpha_2$ to be less than 1 when the LNA gain Vc is between $T_{2L}$ and $T_{2H}$ if the combined gain from such weighting of the direct path, the first stage, and the second stage of the N-stage multipath LNA achieves the LNA gain Vc while reducing overall noise and/or non-linearity characteristics compared to fully enabling the second stage alone by setting $\alpha_2$=1. This process is repeated until the LNA gain Vc is found to be greater than the first gain threshold for the last stage, $T_{NL}$, at which point the last stage is fully enabled by setting $\alpha_N$=1, and $\alpha_0$, $\alpha_1$, ... $\alpha_{N-1}$=0. The gain thresholds $T_{NL}$ and $T_{NH}$ for the last stage may be set to be the same value so that in 722, when the LNA gain Vc is greater than $T_{NL}$, it will also be greater than $T_{NH}$ to set $\alpha_N$=1, and $\alpha_0$, $\alpha_1$ ... $\alpha_{N-1}$=0. Thus, the algorithm in FIG. 7 determines where the LNA gain Vc falls in the x-axis of FIG. 5 to determine the sub-LNA gains for N-stage multipath LNA.

The various embodiments described may be implemented in a wide variety of operating environments, which in some cases can include one or more user electronic devices, integrated circuits, chips, and computing devices—each with the proper configuration of hardware, software, and/or firmware as presently disclosed. Such a system can also include a number of the above exemplary systems working together to perform the same function disclosed herein—to monitor upstream signals in an upstream feed and to provide the spectrum to the base station for analysis.

Most embodiments utilize at least one communications network that would be familiar to those skilled in the art for supporting communications using any of a variety of commercially-available protocols, such as TCP/IP, FTP, UPnP, NFS, and CIFS. The communications network can be, for example, a cable network, a local area network, a wide-area network, a virtual private network, the Internet, an intranet, an extranet, a public switched telephone network, an infrared network, a wireless network and any combination thereof.

The environment can include a variety of data stores and other memory and storage media as discussed above—including at least a buffer. These storage components can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touchsensitive display element or keypad) and at least one output device (e.g., a display device, printer or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM. EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A system comprising:
a multi-stage low noise amplifier (LNA) that is adapted to amplify an input signal through a plurality of gain stages to achieve successively higher gains from successive gain stages, wherein each gain stage has associated noise and non-linearity characteristics, wherein an output from each gain stage is connected to, and multiplied by, a corresponding variable gain to generate a gain path for each gain stage, and wherein the input signal is additionally connected to, and multiplied by, a direct path variable gain to generate a gain path for a direct path;
a combiner that is adapted to add the gain path for each gain stage and the gain path for the direct path to generate a final gain for the multi-stage LNA with an overall noise and non-linearity characteristics; and
a gain control unit that is adapted to evaluate the noise and non-linearity characteristics associated with each gain stage to configure the variable gain corresponding to each gain stage and the direct path variable gain in response to a desired gain for the multi-stage LNA so as to reduce the overall noise or non-linearity characteristics of the multi-stage LNA, and so that the final gain for the multi-stage LNA meets the desired gain.

2. The system of claim 1, wherein the gain control unit is further adapted to configure the variable gain corresponding to a gain stage with a better noise or non-linearity characteristics to be larger than the variable gain corresponding to a gain stage with a worse noise or non-linearity characteristics.

3. The system of claim 2, wherein the noise or non-linearity characteristics associated with a gain path having a lower number of gain stages are better than the noise or non-linearity characteristics associated with a gain path having a higher number of gain stages, and the variable gain corresponding to the gain path having the lower number of gain stages is configured to be larger than the variable gain corresponding to the gain path having the larger number of gain stages.

4. The system of claim 1, wherein the gain control unit is further adapted to determine a number of gain stages and to configure to zero the variable gains corresponding to all gain paths having a number of gain stages higher than the determined number of gain stages, so that when the gain paths having a number of gain stages equal or below the determined number of gain stages are combined by the combiner, the final gain is sufficient to meet the desired gain.

5. The system of claim 4, wherein the gain control unit is further adapted to determine a maximum number of gain paths having non-zero variable gains corresponding to the gain paths having a number of gain stages equal or below the determined number of gain stages.

6. The system of claim 5, wherein the maximum number of gain paths is two and the two gain paths having the non-zero variable gains comprise the gain path having a number of gain stages equal to the determined number of gain stages and the gain path having a number of gains stage that is one less than the determined number of gain stages.

7. The system of claim 4, wherein the gain control unit is further adapted to configure to non-zero the variable gain corresponding to the gain path having a number of gain stages equal to determined number of gain stages, and to configure to zero the plurality of variable gains corresponding to all other gain paths.

8. The system of claim 4, wherein the gain control unit is further adapted to configure the plurality of variable gains in accordance with waveform variations of the plurality of variable gains as a function of a range of the desired gain wherein at most two variable gains have non-zero values at any desired gain.

9. The system of claim 8, wherein the waveform variations comprise a decreasing slope for one of the two non-zero variable gains and an increasing slope for the other non-zero variable gain at any desired gain.

10. The system of claim 1, wherein the output of one of the gain stages is additionally connected to, and multiplied by, a non-linear variable gain to generate a non-linearizing gain path, and the gain path for said one of the gain stages is combined with the non-linearizing gain path to linearize the gain path.

11. A method comprising:
- amplifying an input signal through a plurality of gain stages to achieve successively higher gains from successive gain stages, wherein each gain stage has associated noise and non-linearity characteristics, wherein an output from each gain stage is multiplied by a corresponding variable gain to generate a gain path for each gain stage, and wherein the input signal is additionally multiplied by a direct path variable gain to generate a gain path for a direct path;
- combining the gain path for each gain stage of the plurality of gain stages and the gain path for the direct path to generate an output signal whose power is amplified by a final gain from a power of the input signal with an overall noise and non-linearity characteristics; and
- evaluating by a processor the noise and non-linearity characteristics associated with each gain stage and configuring the variable gain corresponding to each gain stage and the direct path variable gain in response to a desired gain of the power of the output signal from the power of the input signal so as to reduce the overall noise or non-linearity characteristics of the output signal and to have the final gain satisfy the desired gain.

12. The method of claim 11, wherein said evaluating by the processor the noise and non-linearity characteristics associated with each gain stage further comprises configuring the variable gain corresponding to a gain stage with a better noise or non-linearity characteristics to be larger than the variable gain corresponding to a gain stage with a worse noise or non-linearity characteristics.

13. The method of claim 12, wherein the noise or non-linearity characteristics associated with a gain path having a lower number of gain stages are better than the noise or non-linearity characteristics associated with a gain path having a higher number of gain stages, and wherein said evaluating by the processor the noise and non-linearity characteristics associated with each gain stage further comprises configuring the variable gain corresponding to the gain path having the lower number of gain stages to be larger than the variable gain corresponding to the gain path having the larger number of gain stages.

14. The method of claim 11, wherein said evaluating by the processor the noise and non-linearity characteristics associated with each gain stage further comprises determining a number of gain stages and configuring to zero the variable gains corresponding to all gain paths having a number of gain stages higher than the determined number of gain stages, so that when the gain paths having a number of gain stages equal or below the determined number of gain stages are combined, the final gain is sufficient to meet the desired gain.

15. The method of claim 14, wherein said evaluating by the processor the noise and non-linearity characteristics associated with each gain stage further comprises determining a maximum number of gain paths having non-zero variable gains corresponding to the gain paths having a number of gain stages equal or below the determined number of gain stages.

16. The method of claim 15, wherein the maximum number of gain paths is two and wherein said evaluating by the processor the noise and non-linearity characteristics associated with each gain stage further comprises configuring to non-zero the variable gains corresponding to the gain path having a number of gain stages equal to the determined number of gain stages and the gain path having a number of gains stage that is one less than the determined number of gain stages.

17. The method of claim 14, wherein said evaluating by the processor the noise and non-linearity characteristics associated with each gain stage further comprises configuring to non-zero the variable gain corresponding to the gain path having a number of gain stages equal to determined number of gain stages, and configuring to zero the plurality of variable gains corresponding to all other gain paths.

18. The method of claim 14, wherein said evaluating by the processor the noise and non-linearity characteristics associated with each gain stage further comprises configuring the plurality of variable gains in accordance with waveform variations of the plurality of variable gains as a function of a range of the desired gain wherein at most two variable gains have non-zero values at any desired gain.

19. The method of claim 18, wherein the waveform variations comprise a decreasing slope for one of the two non-zero variable gains and an increasing slope for the other non-zero variable gain at any desired gain.

20. The method of claim 11, wherein said amplifying an input signal through a plurality of gain stages further comprises multiplying one of the gain stages by a non-linear variable gain to generate a non-linearizing gain path, and combining the gain path for said one of the gain stages with the non-linearizing gain path to linearize the gain path.

* * * * *